United States Patent
Kim et al.

(10) Patent No.: US 7,498,226 B2
(45) Date of Patent: Mar. 3, 2009

(54) METHOD FOR FABRICATING SEMICONDUCTOR DEVICE WITH STEP GATED ASYMMETRIC RECESS

(75) Inventors: Seung-Bum Kim, Kyoungki-do (KR); Jae-Young Kim, Kyoungki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 244 days.

(21) Appl. No.: 11/400,296

(22) Filed: Apr. 7, 2006

(65) Prior Publication Data

US 2007/0004152 A1 Jan. 4, 2007

(30) Foreign Application Priority Data

Jun. 30, 2005 (KR) ...................... 10-2005-0058146

(51) Int. Cl.
*H01L 21/336* (2006.01)

(52) U.S. Cl. .................. 438/286; 438/268; 438/270; 438/427; 438/439; 438/700; 438/706; 438/710; 438/724; 438/738; 257/E21.427; 257/E21.428; 257/E21.429

(58) Field of Classification Search ................ 438/286, 438/710, 719, 735, 736, 738, 218, 268, 270–272, 438/439, 443, 427–428, 700, 706, 724, 744; 257/E21.427–E21.429

See application file for complete search history.

(56) References Cited

U.S. PATENT DOCUMENTS

| 5,920,094 | A | | 7/1999 | Nam |
| 5,942,447 | A | | 8/1999 | Miyakuni |
| 6,465,831 | B1 | | 10/2002 | Park et al. |
| 6,902,681 | B2 | * | 6/2005 | Nallan et al. ................... 216/67 |
| 7,153,755 | B2 | * | 12/2006 | Liu et al. ..................... 438/424 |
| 7,354,828 | B2 | * | 4/2008 | Cho ........................... 438/270 |
| 2005/0009342 | A1 | * | 1/2005 | Chen et al. ................... 438/689 |
| 2005/0106822 | A1 | * | 5/2005 | Lee et al. ..................... 438/294 |
| 2005/0173744 | A1 | * | 8/2005 | Kim et al. ................... 257/296 |
| 2005/0214674 | A1 | * | 9/2005 | Sui et al. ................. 430/270.1 |
| 2006/0211213 | A1 | * | 9/2006 | Kim ........................... 438/424 |

FOREIGN PATENT DOCUMENTS

| KR | 1020040001945 A | | 1/2004 |
| KR | 2007016630 | * | 2/2007 |

* cited by examiner

*Primary Examiner*—Matthew S. Smith
*Assistant Examiner*—Joseph C Nicely
(74) *Attorney, Agent, or Firm*—Townsend and Townsend and Crew LLP

(57) ABSTRACT

A method for fabricating a semiconductor device with a step gated asymmetric recess is provided. The method includes: forming an organic bottom anti-reflective coating (BARC) layer over a substrate; forming a patterned mask over the organic BARC layer that expose selected portions of the organic BARC layer; etching the exposed portions of the organic BARC layer using an etch gas with high selectivity to the substrate until the substrate underlying the exposed portions of the organic BARC layer is substantially exposed; etching the exposed portions of the substrate to form a plurality of recessed active regions; removing the mask and the organic BARC layer to expose a plurality of protruding active regions defined by the recessed active regions; forming a gate insulation layer over the recessed active regions and the protruding active regions; and forming asymmetric step-structured gates over the gate insulation layer, each gate extending over the corresponding recessed active region and the corresponding protruding active region.

17 Claims, 8 Drawing Sheets

METHOD FOR FABRICATING SEMICONDUCTOR DEVICE WITH STEP GATED ASYMMETRIC RECESS

BACKGROUND OF THE INVENTION

1. Field of the Invention

The present invention relates to a method for fabricating a semiconductor device; and, more particularly, to a method for fabricating a semiconductor device using a step gated asymmetric recess (STAR) process.

2. Description of the Related Art

Recently, a refresh characteristic has been deteriorated due to short channels formed during a sub-100 nm level dynamic random access memory (DRAM) fabrication. To overcome this limitation, a step gated asymmetric recess (STAR) technology has been introduced. The STAR technology refers to recessing a portion of an active region to several tens of nanometers and having a portion of a gate extending over the recess.

Figure 1A:
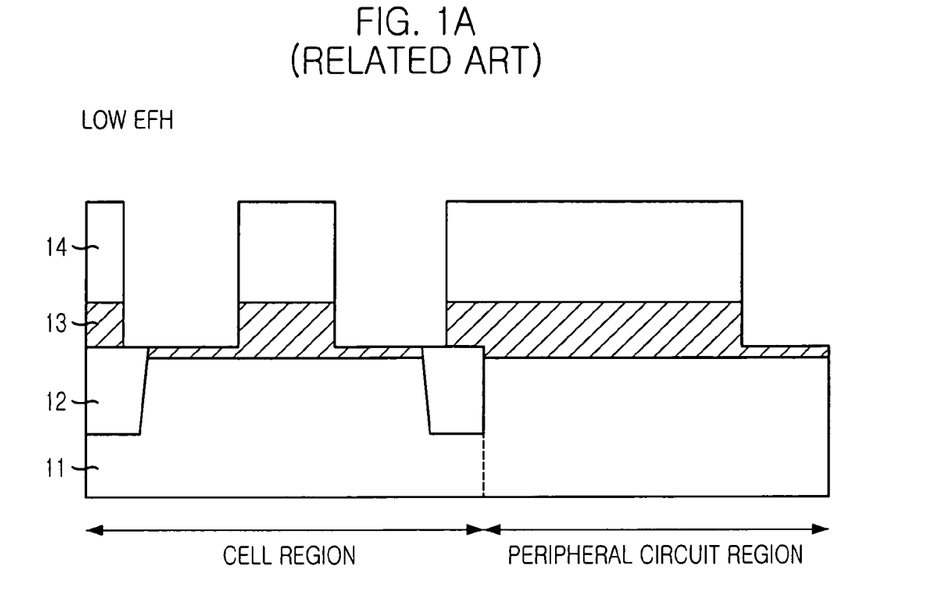
FIGS. 1A to 1D are cross-sectional views illustrating a conventional method for fabricating a semiconductor device using a step gated asymmetric recess (STAR) process.
Figure 1B:
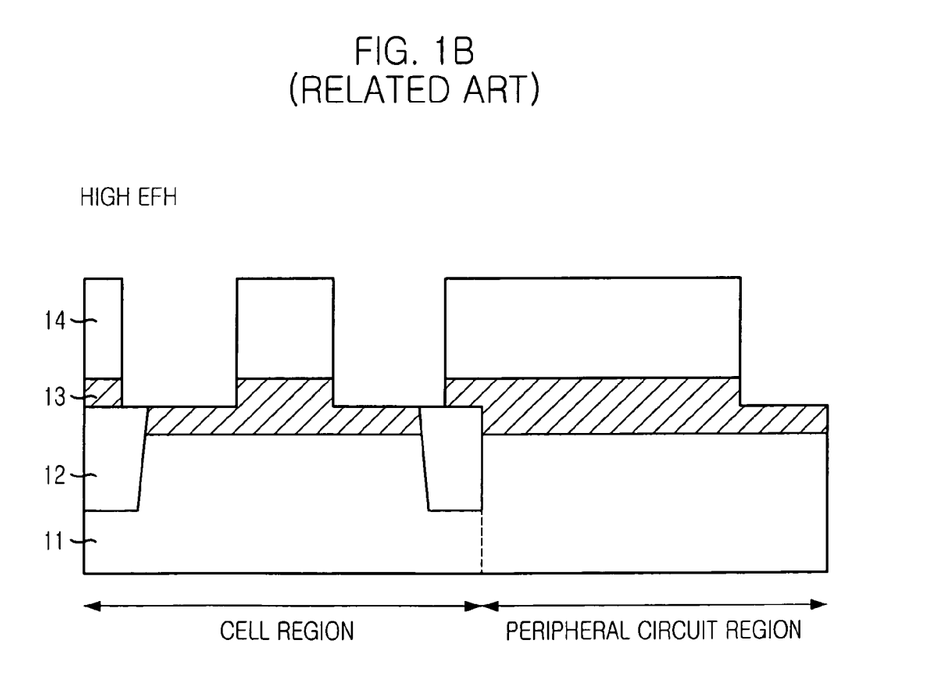
Figure 1C:
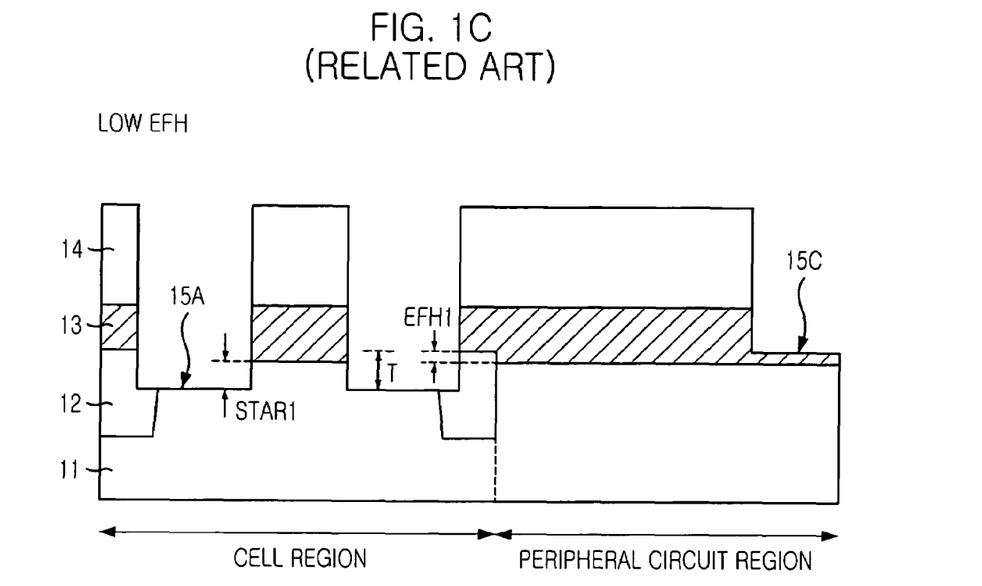
Figure 1D:
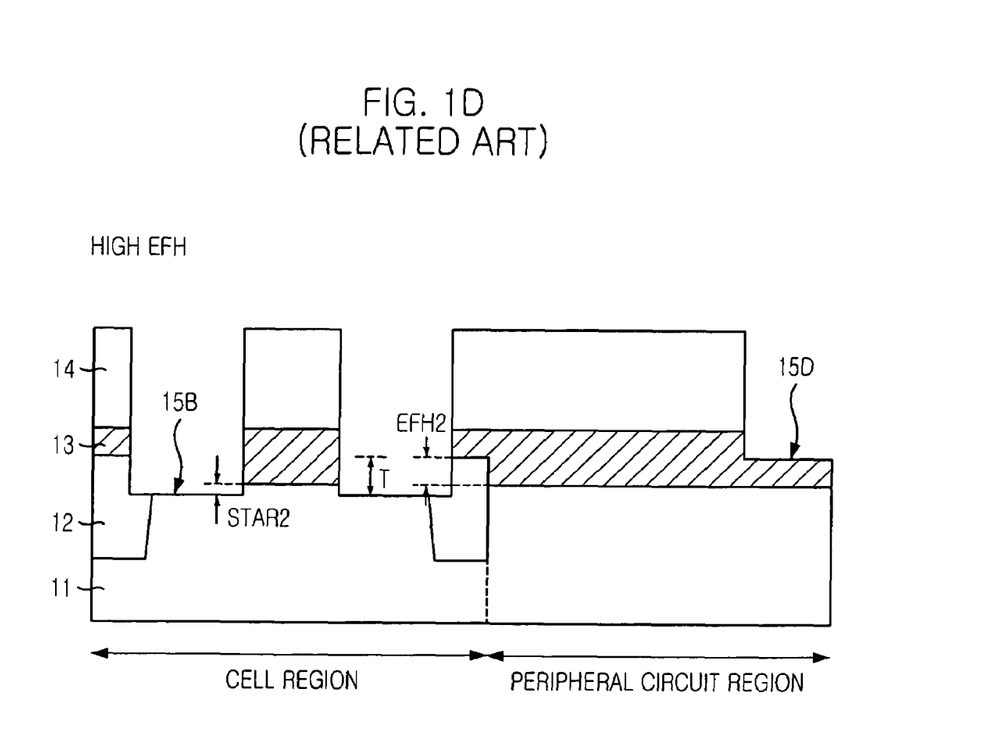

FIGS. 1A to 1D are cross-sectional views illustrating a conventional method for fabricating a semiconductor device using a STAR process. FIGS. 1A and 1C show a substrate structure with a low effective field oxide height (EFH), and FIGS. 1B and 1D show a substrate structure with a high EFH.

As shown in FIGS. 1A and 1B, device isolation regions 12 are formed in predetermined portions of a substrate 11 using a shallow trench isolation (STI) process.

Subsequently, an organic bottom anti-reflective coating layer 13 is formed over the substrate 11 and the device isolation regions 12. Although not illustrated, a photoresist layer is formed over the organic bottom anti-reflective coating layer 13. Then, an exposure and developing process is performed to pattern the photoresist layer to form a STAR mask 14. Portions of the organic bottom anti-reflective coating layer 13 are etched using the STAR mask 14 as an etch barrier.

As shown in FIGS. 1C and 1D, predetermined portions of the substrate 11 are etched to form recessed active regions 15A and 15B.

In the above conventional technology, the organic bottom anti-reflective coating layer 13 is introduced for the easier patterning process of the STAR mask 14; the recessed active regions 15A and 15B are formed; and test patterns 15C and 15D for measuring depths of the recessed active regions 15A and 15B are formed in a peripheral circuit region. That is, because measuring the depths of the recessed active regions 15A and 15B in a cell region is often difficult, the test patterns 15C and 15D are formed in the peripheral circuit region to monitor the depths of STAR patterns, which are the recessed active regions 15A and 15B.

However, in the conventional technology, if a difference in the EFH between the substrate 11 and the individual device isolation region 12 is generated, the organic bottom anti-reflective coating layer 13 is etched with a different thickness. Consequently, the depths of the recessed active regions 15A and 15B become different. That is, the depth STAR1 of the recessed active region 15A with the low EFH (or EFH1) is formed deeper than the depth STAR2 of the recess active region 15B with the high EFH (or EFH2). If an etch target 'T' of 400 Å is etched during the recessed active region formation, the maximum depth difference between the recessed active regions 15A and 15B is observed to be 103 Å with respect to the difference of EFH within a wafer. Thus, the depths of the recessed active regions change due to the EFH changes.

For example, if the difference of EFH is 100 Å, the difference of EFH is 100 Å from a wafer to a wafer and from a lot to a lot. Thus, it may be difficult to obtain depth uniformity of the recessed active regions.

Consequently, the depth uniformity defect of the recessed active regions may generate a difference in silicon etch loss, and thus, increases fluctuations with respect to refresh, resistance, and cell threshold voltage within the wafer. That is, the depth uniformity of the recessed active regions may not be obtained due to the difference in EFH between the active regions and the device isolation regions.

BRIEF SUMMARY OF THE INVENTION

Embodiments of the present invention provide a method for fabricating a semiconductor device having a step gated asymmetric recess (STAR) gate capable of securing depth uniformity of recessed active regions, regardless of an EFH difference generated within a wafer (or substrate) during a STAR process.

In one embodiment, a method for fabricating a semiconductor device includes forming an organic bottom anti-reflective coating (BARC) layer over a substrate; forming a patterned mask over the organic BARC layer that expose selected portions of the organic BARC layer; etching the exposed portions of the organic BARC layer using an etch gas with high selectivity to the substrate until the substrate underlying the exposed portions of the organic BARC layer is substantially exposed; etching the exposed portions of the substrate to form a plurality of recessed active regions; removing the mask and the organic BARC layer to expose a plurality of protruding active regions defined by the recessed active regions; forming a gate insulation layer over the recessed active regions and the protruding active regions; and forming asymmetric step-structured gates over the gate insulation layer, each gate extending over the corresponding recessed active region and the corresponding protruding active region.

In another embodiment, a method for fabricating a semiconductor device includes forming an organic bottom anti-reflective coating (BARC) layer over a first portion of a substrate and a plurality of first isolation structures, the first isolation structures having a first effective field oxide height (EFH), the EFH being a height difference between a given isolation structure and the substrate. A patterned mask is formed over the organic BARC layer, the patterned mask having a plurality of openings to expose selected portions of the organic BARC layer. The exposed portions of the organic BARC layer are etched using an etch gas with high selectivity to the substrate and the first isolation structures until portions of the organic BARC layer provided directly below the mask openings are substantially removed to expose the first portion of the substrate and the first isolation structures. The exposed first portions of the substrate and the first isolation structures are etched to form a plurality of first recessed active regions, the substrate being etched to a first target depth. The mask and the organic BARC layer are removed to expose a plurality of protruding active regions defined by the first recessed active regions. A gate insulation layer is formed over the first recessed active regions and the protruding active regions. Asymmetric step-structured gates are formed over the gate insulation layer, each gate extending over the corresponding first recessed active region and the corresponding protruding active region.

The organic BARC layer is provided over a second portion of the substrate and a plurality of second isolation structures, the second isolation structures having a second EFH, wherein the organic BARC layer is etched to expose the second portion of the substrate and the second isolation structures. The exposed second portion of the substrate is etched to a second target depth that is substantially the same as the first target depth, wherein the first portion of the substrate, the first isolation structures, the second portion of the substrate, and the second isolation structures are etched at the same time.

DETAILED DESCRIPTION OF THE INVENTION

A method for fabricating a semiconductor device with a step gated asymmetric recess in accordance with specific embodiments of the present invention will be described in detail with reference to the accompanying drawings.

FIGS. 2A to 2H are cross-sectional views illustrating a method for fabricating a semiconductor device in accordance with a specific embodiment of the present invention. FIGS. 2A, 2C, 2E and 2G show a substrate structure with a low effective field oxide height (EFH), and FIGS. 2B, 2D, 2F and 2H show a substrate structure with a high EFH.

Figure 2A:
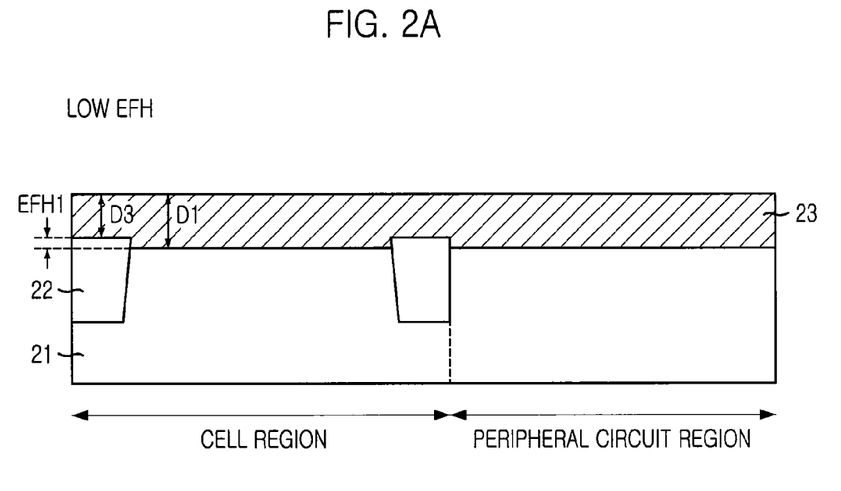
FIGS. 2A to 2H are cross-sectional views illustrating a method for fabricating a semiconductor device in accordance with a specific embodiment of the present invention.
Figure 2B:
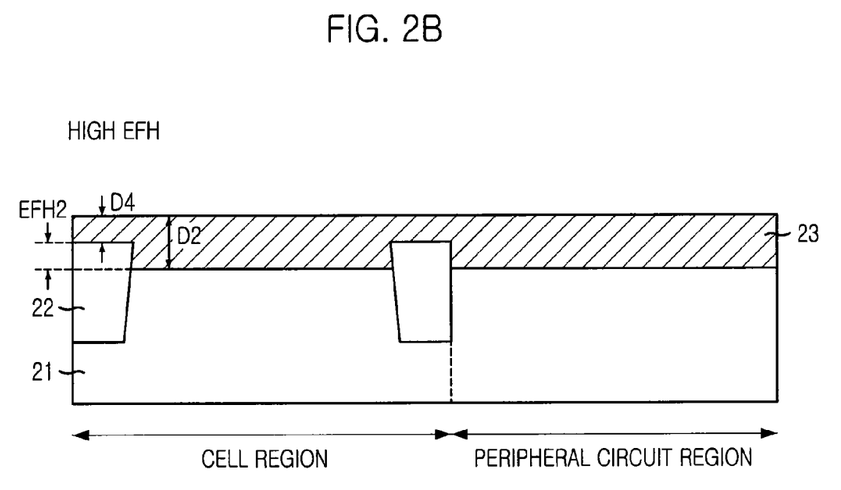

As shown in FIGS. 2A and 2B, device isolation structures 22 are formed in predetermined portions of a substrate 21 using a shallow trench isolation (STI) process.

Subsequently, an organic bottom anti-reflective coating (BARC) layer 23 for use in a photo mask process is formed over the substrate 21 and the device isolation structures (or isolation structures) 22. At this time, the organic BARC layer 23 is formed to a thickness ranging from approximately 100 Å to approximately 900 Å. Even if the substrate structures in FIGS. 2A and 2B have different EFHs (i.e., EFH1 is different than EFH2), thicknesses D1 and D2 of the organic BARC layer 23 are substantially the same. However, thicknesses D3 and D4 are different. The thicknesses D1 and D2 are the thicknesses for the BARC layer 23 from the upper surface of the BARC layer to the upper surface of the substrate 21 for the substrate structures with low EFH and high EFH, respectively. The thicknesses D3 and D4 are the thicknesses for the BARC layer 23 from the upper surface of the BARC layer to the upper surface of the device isolation structure 22 for the substrate structures with low EFH and high EFH, respectively.

Figure 2C:
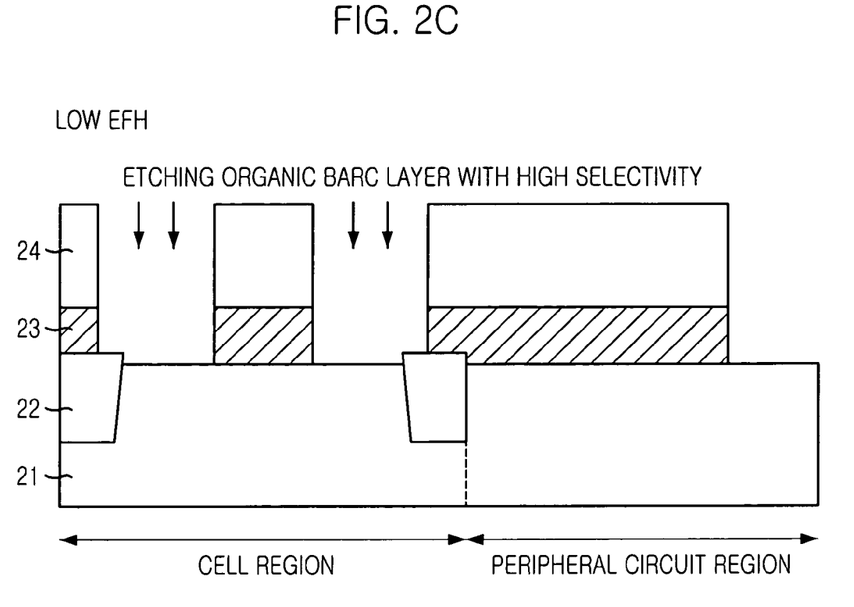
Figure 2D:
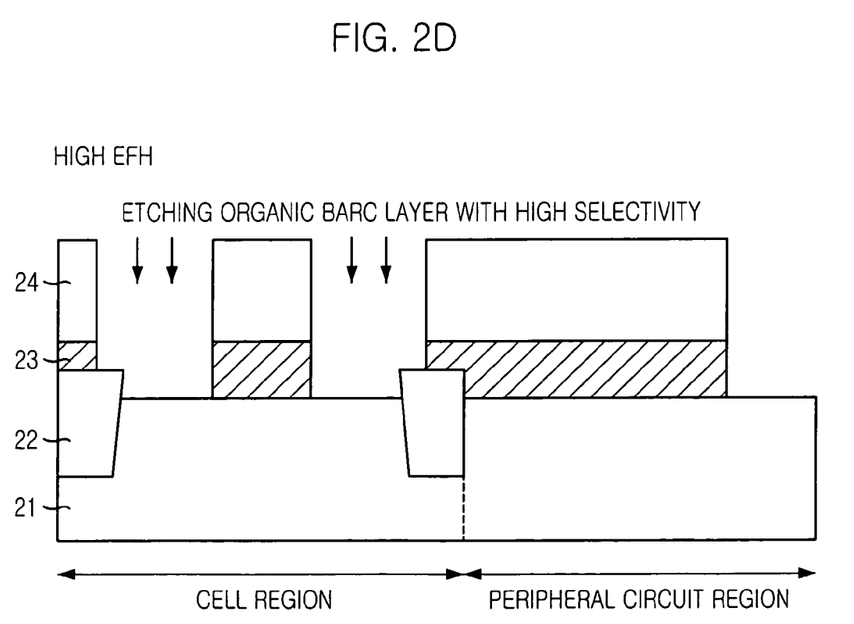

As shown in FIGS. 2C and 2D, a photoresist layer is formed over the organic BARC layer 23, and an exposure and developing process is performed to pattern the photoresist layer to thereby form a STAR mask 24 having openings that expose selected portions of the BARC layer 23. These exposed portions of the organic BARC layer 23 are etched using the STAR mask 24.

The organic BARC layer 23 includes an organic material, and is coated over the substrate 21 and the device isolation structures 22. Thus, the organic BARC layer 23 is provided with a flat upper surface, without being affected by the topology of the structures below. Therefore, if the device isolation structures 22 are formed to have high EFH, then the active regions are formed on the substrate 21 that is that much lower than the device isolation structures 22. Herein, a thickness of the organic BARC layer 23, formed between the top surface of the individual device isolation structure 22 and the top surface of the substrate 21, becomes greater as the height of the device isolation structure 22 is increased. If the organic BARC layer 23 is etched according to the conditions described above, a large difference in depth is generated between a monitoring region (i.e., a peripheral circuit region) and a cell region.

Thus, the organic BARC layer 23 is etched with high selectivity to silicon and oxide, the materials used for the substrate 21 and the device isolation regions 22, respectively. Therefore, the organic BARC layer 23 can be etched at the cell region and the peripheral circuit region without having to worry about over etching and removing too much of the substrate 21 or the device isolation structure 22, since the etch recipe used has high selectivity to silicon and oxide. Similarly the etch process can be conducted without worrying about the height difference of the device isolation structures 22 (i.e., the difference in EFHs). A STAR pattern subsequently formed can be easily provided with a uniform depth.

Examples of the etch gas used to increase the selectivity of the organic BARC layer 23 and the underlying structures during the BARC layer etch step are a gas mixture including nitrogen ($N_2$) and oxygen ($O_2$), and a gas mixture including nitrogen ($N_2$), oxygen ($O_2$), and carbon monoxide (CO). In one implementation, $N_2$ is flowed into the process chamber (not shown) at approximately 20 sccm to approximately 40 sccm. A ratio of $N_2$ to $O_2$ in the gas mixture is in a range of approximately 1:1 to approximately 3:1. If the gas mixture includes CO, a ratio of $N_2$ to CO is in a range of approximately 1:1 to approximately 1:2, and a ratio of $N_2$ to $O_2$ is in a range of approximately 1:1 to approximately 3:1, and $N_2$ is flowed into the process chamber at approximately 10 sccm to approximately 30 sccm.

If the organic BARC layer 23 is etched under the above conditions, the selectivity of the organic BARC layer 23 with respect to the underlying structures becomes higher than 20:1. For example, an etch selectivity of the organic BARC layer 23 to the device isolation structure 22 is approximately 25.1:1, and an etch selectivity of the organic BARC layer 23 to the substrate 21 is approximately 25:1. The selectivity of the organic BARC layer 23 to the underlying structures is controlled to be within a range of approximately 20:1 to approximately 30:1 in the present implementation. This enables the organic BARC layer 23 to be completely etched away (or substantially removed) until the underlying structures are exposed without resulting in significant removal of the underlying structures. Accordingly, the above BARC layer etch step can be performed regardless of the EFH differences on the substrate.

In the present embodiment, the organic BARC layer 23 is etched using a plasma etch process using a plasma source selected from the group consisting of inductively coupled plasma (ICP), transformer coupled plasma (TCP), reactive ion etching (RIE), magnetically enhanced RIE (MERIE), microwave, and electron cyclotron resonance (ECR). Herein, a plasma source power is controlled to range between approximately 100 W and approximatley 300 W. A mid-to-low chamber pressure ranging from approximately 10 mTorr to approximately 50 mTorr is used.

Figure 2E:
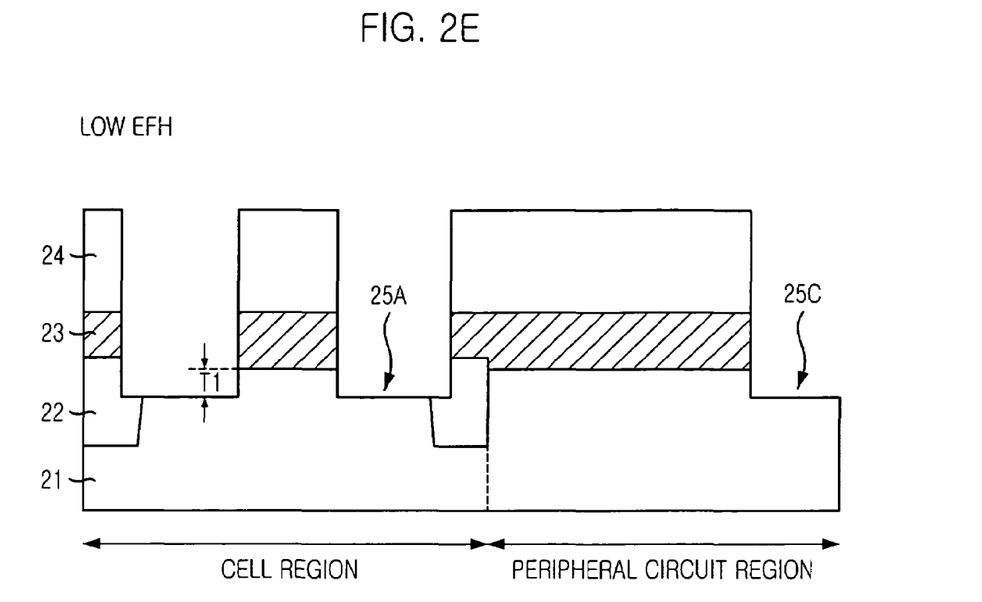
Figure 2F:
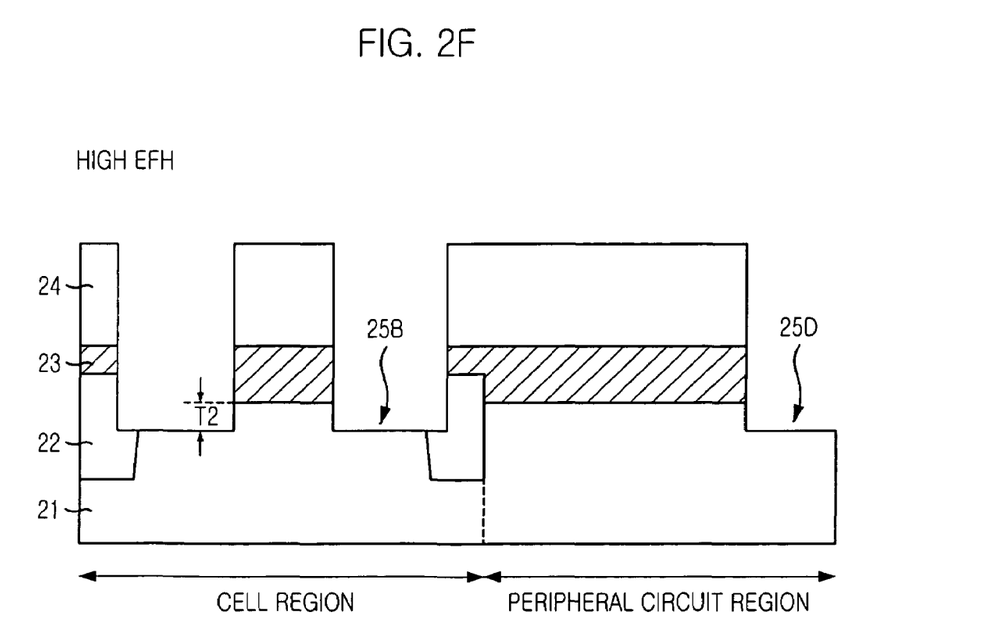

Referring to FIGS. 2E and 2F, after the BARC layer etch, the exposed portions of the device isolation structure 22 and the substrate 21 are etched to a predetermined depth to form recessed active regions 25A and 25B at low and high EFH regions, respectively. Such a process is referred to as the "STAR etching process" since the recessed active regions 25A and 25B are formed in recess structures. Herein, the recessed active regions 25A and 25B are formed in the cell region, while test patterns 25C and 25D are formed in the peripheral circuit region to measure the depths of the recessed active regions 25A and 25B. The test patterns 25C and 25D are formed to monitor the depths of the recessed active regions 25A and 25B because it is difficult to measure the depths of the recessed active regions 25A and 25B in the cell region.

During the STAR etching process, since the organic BARC layer 23 had been etched away completely (or nearly so) regardless of the EFH differences on the substrate, the substrate 21 can be etched to substantially the same target thickness at the low and high EFH regions, so that the target thicknesses T1 for the low EFH region is substantially the same as the target thickness T2 for the high EFH region. Thus, the recessed active regions 25A and 25B have substantially the same depth in all regions of the wafer. The substrate 21 is etched to form the recessed active regions 25A and 25B by employing a gas mixture of hydrogen bromide (HBr), chlorine ($Cl_2$), and oxygen ($O_2$).

For example, if an etch target thickness of the recessed active regions 25A and 25B is approximately 400 Å, because only the substrate 21 is etched, the recessed active regions 25A and 25B can be provided with a substantially uniform depth according to the present embodiment. However, during the conventional STAR etching process, it is difficult to etch the different regions of the substrate to a substantially the same depth because the etch target thickness includes the thickness of the organic BARC layer 13 remaining on the substrate after the etching of the BARC layer 13. The remaining BARC layer 13 has different thicknesses at low and high EFH regions.

Figure 2G:
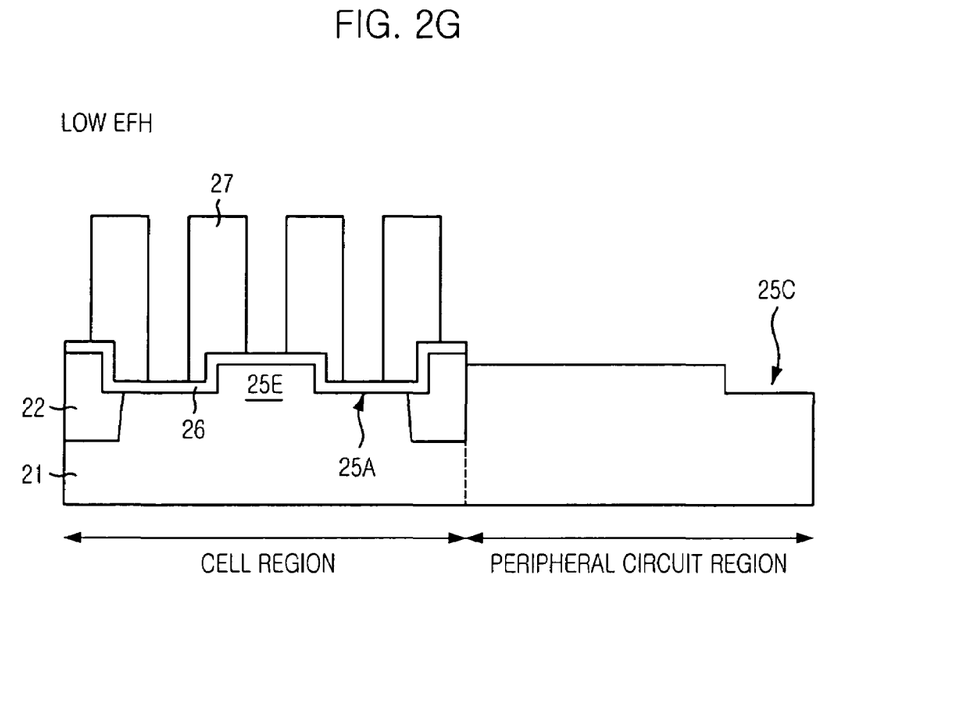
Figure 2H:
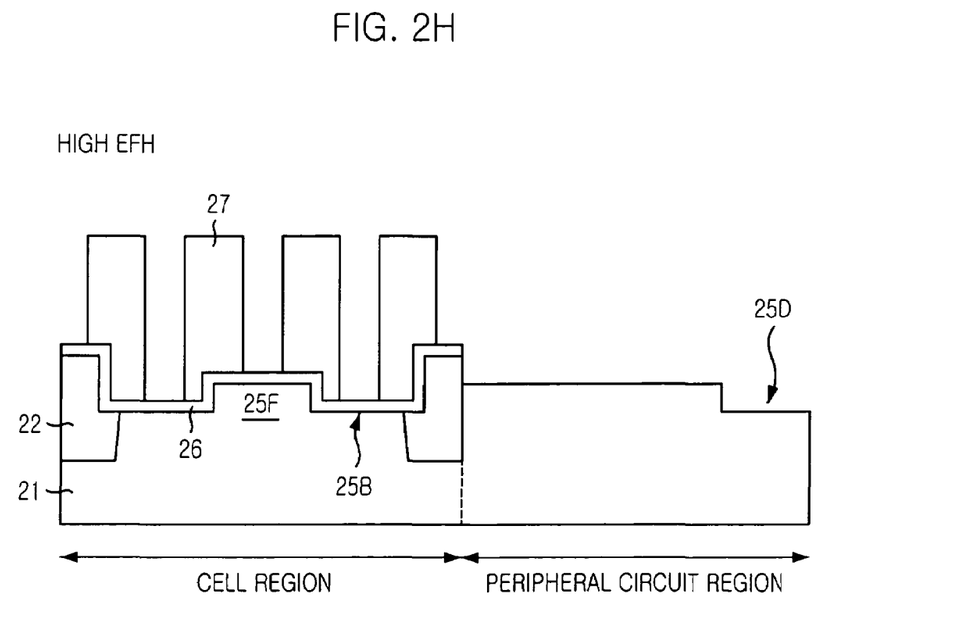

Referring to FIGS. 2G and 2H, the STAR mask 24 and the organic BARC layer 23 are stripped after the recessed active regions 25A and 25B have been formed. Protruding active regions 25E and 25F are defined by the recessed active regions 25A and 25B.

A gate insulation layer 26 is formed over the substrate structure obtained after the removal of the STAR mask 24 and the organic BARC layer 23. Then, asymmetric step-structured gates 27 are formed over the gate insulation layer 26, each of the asymmetric step-structured gates 27 extending over the corresponding recessed active region 25A or 25B and the corresponding protruding active region 25E or 25F. Such a process of forming the asymmetric step-structured gates 27 is referred to as the STAR process.

Figure 3A:
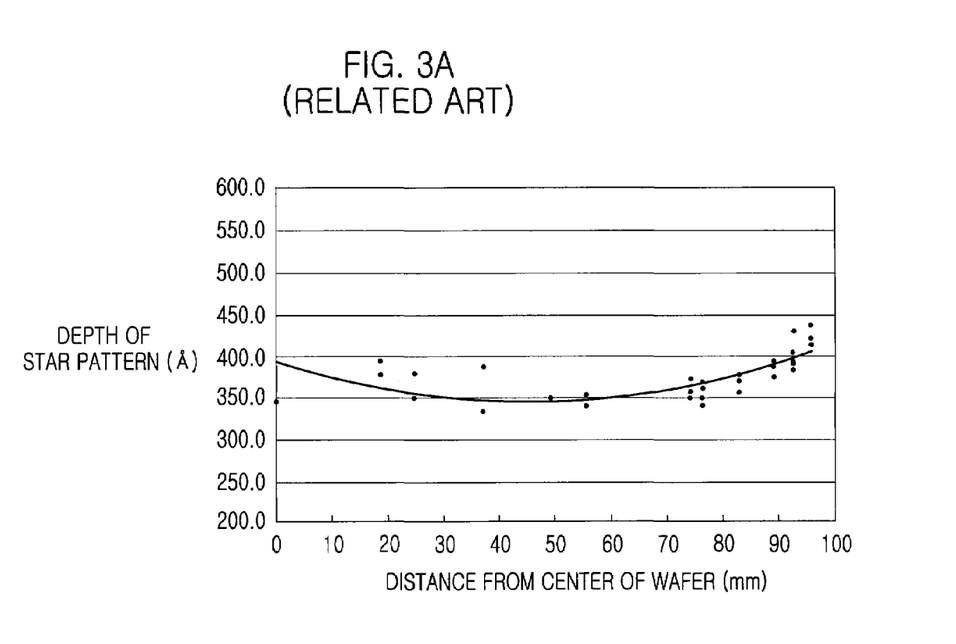
FIG. 3A is a graph illustrating depths of a typical type of a STAR pattern.
Figure 3B:
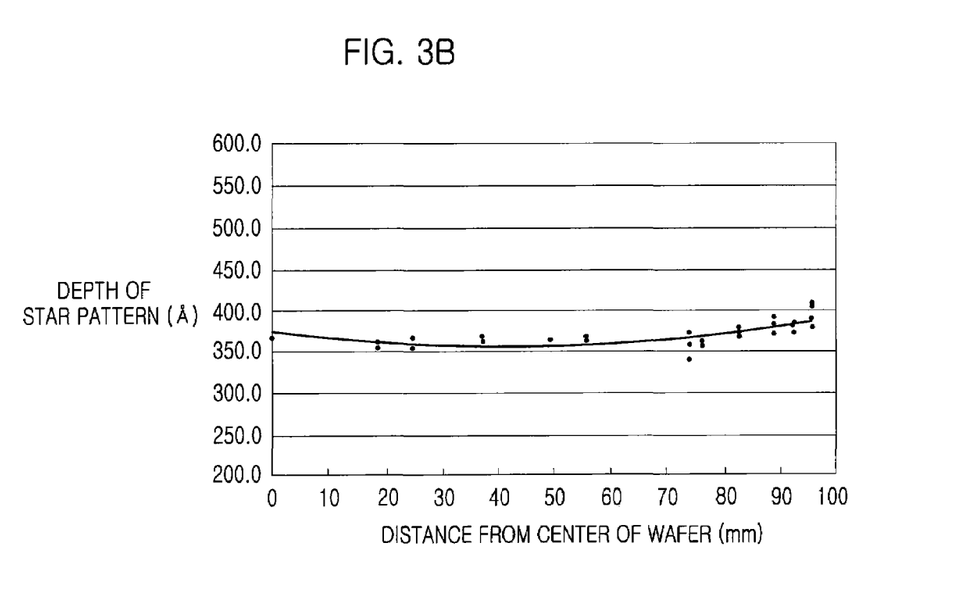
FIG. 3B is a graph illustrating depths of a STAR pattern in accordance with a specific embodiment of the present invention.
Figure 4:
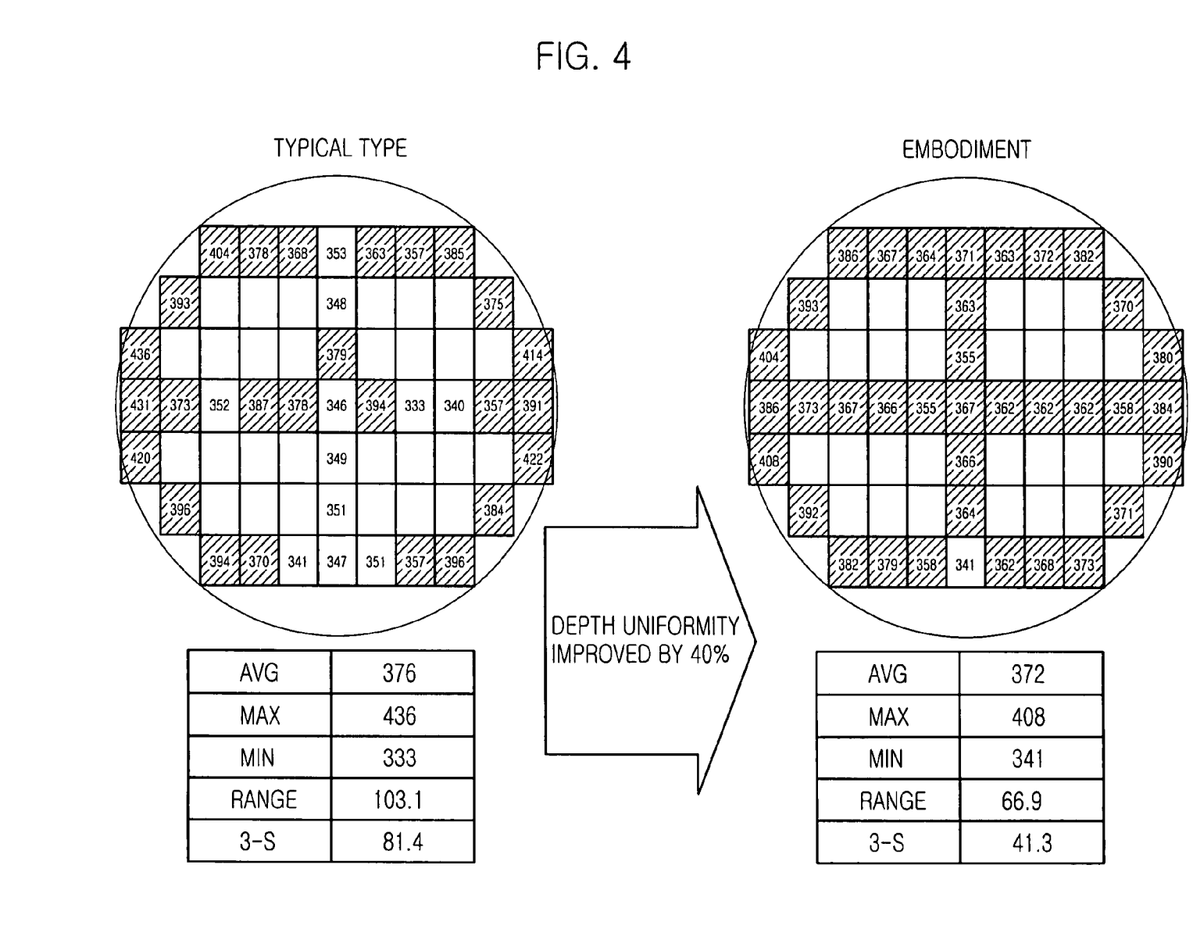
FIG. 4 shows wafer maps illustrating depths of a typical STAR pattern and a STAR pattern in accordance with the present invention.

FIG. 3A is a graph illustrating depths of a recessed active region formed according to the conventional method, and FIG. 3B is a graph illustrating depths of a recessed active region in according to the present embodiment. FIG. 4 illustrates wafer maps showing the depths of the recessed active regions according to the conventional method (shown on the left) and the depths of the recessed active regions according to the present embodiment (shown on the right).

As illustrated, the recessed active regions according to the conventional method show a maximum depth difference of approximately 103.1 Å; however, the recessed active regions according to the present embodiment show a much smaller maximum depth difference of approximately 66.9 Å.

In accordance with the specific embodiment of the present invention, the critical dimensions and depth of the STAR pattern can be formed more uniformly over the entire regions of the wafer by performing the etching of the organic BARC layer with high selectivity to the materials underlying the BARC layer. Thus, fluctuations of electrical characteristics, i.e., refresh, resistance, and cell threshold voltage, can be minimized, resulting in improved reliability for the device.

The present application contains subject matter related to the Korean patent application No. KR 2005-58146, filed in the Korean Patent Office on Jun. 30, 2005, which is incorporated by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   forming an organic bottom anti-reflective coating (BARC) layer over a substrate;
   forming a patterned mask over the organic BARC layer that exposes selected portions of the organic BARC layer;
   etching the exposed portions of the organic BARC layer using an etch gas having a high selectivity to the substrate until the substrate underlying the exposed portions of the organic BARC layer is substantially exposed;
   etching the exposed portions of the substrate to form a plurality of recessed active regions;
   removing the mask and the organic BARC layer to expose a plurality of protruding active regions defined by the recessed active regions;
   forming a gate insulation layer over the recessed active regions and the protruding active regions; and
   forming asymmetric step-structured gates over the gate insulation layer, each gate extending over the corresponding recessed active region and the corresponding protruding active region,
   wherein the substrate includes a high effective field oxide height (EFH) region and a low EFH region, wherein the substrate is etched to substantially the same depth at the high EFH region and the low EFH region to form the active recessed regions at the high EFH region and the low EFH region.

2. The method of claim 1, wherein the etching of the organic BARC layer includes setting the selectivity of the organic BARC layer to the substrate to be within a range of approximately 20:1 to approximately 30:1 and wherein the substrate comprises primarily silicon.

3. The method of claim 2, wherein the etch gas includes nitrogen ($N_2$) and oxygen ($O_2$) and the substrate comprises primarily silicon.

4. The method of claim 3, wherein a ratio of $N_2$ to $O_2$ in the etch gas ranges from approximately 1:1 to approximately 3:1.

5. The method of claim 4, wherein a flow rate of $N_2$ ranges from approximately 20 sccm to approximately 40 sccm.

6. The method of claim 1, wherein the etch gas includes $N_2$ and $O_2$, or $N_2$, $O_2$, and carbon monoxide (CO).

7. The method of claim 6, wherein a ratio of $N_2$ to CO ranges from approximately 1:1 to approximately 1:2.

8. The method of claim 7, wherein a flow rate of $N_2$ ranges from approximately 10 sccm to approximately 30 sccm.

9. The method of claim 6, wherein a ratio of $N_2$ to $O_2$ ranges from approximately 1:1 to approximately 3:1.

10. The method of claim 9, wherein a flow rate of $N_2$ ranges from approximately 10 sccm to approximately 30 sccm.

11. The method of claim 1, wherein the etching of the organic BARC layer is performed by employing a plasma etching process using a plasma source selected from the group consisting of inductively coupled plasma (ICP), transformer coupled plasma (TCP), reactive ion etching (RIE), magnetically enhanced RIE (MERIE), microwave, and electron cyclotron resonance (ECR).

12. The method of claim 11, wherein the plasma etching process includes using a plasma source power ranging from approximately 100 W to approximately 300 W.

13. The method of claim 11, wherein the plasma etching process includes using a mid-to-low chamber pressure ranging from approximately 10 mTorr to approximately 50 mTorr.

14. A method for fabricating a semiconductor device, the method comprising:
    forming an organic bottom anti-reflective coating (BARC) layer over a first portion of a substrate and a plurality of first isolation structures, the first isolation structures having a first effective field oxide height (EFH), and over a second portion of the substrate and a plurality of second isolation structures, the second isolation structures having a second EFH, wherein the EFH is a height difference between a given isolation structure and the substrate, the first EFH and the second EFH having different values;
    forming a patterned mask over the organic BARC layer, the patterned mask having a plurality of openings to expose selected portions of the organic BARC layer;
    etching the exposed portions of the organic BARC layer using an etch gas with high selectivity to the substrate and the first and second isolation structures until portions of the organic BARC layer provided directly below the mask openings are substantially removed to expose the first portion of the substrate and the first isolation structures and the second portion of the substrate and the second isolation structures;
    etching the exposed first and second portions of the substrate and the first and second isolation structures to form a plurality of first recessed active regions and a plurality of second recessed active regions, the first portion of the substrate being etched to a first target depth and the second portion of the substrate being etched to a second target depth;
    removing the mask and the organic BARC layer to expose a plurality of protruding active regions defined by the first and second recessed active regions;
    forming a gate insulation layer over the recessed active regions and the protruding active regions; and
    forming asymmetric step-structured gates over the gate insulation layer, each gate extending over the corresponding recessed active region and the corresponding protruding active region,
    wherein a depth of the first recessed active regions and a depth of the second recessed active regions are substantially the same.

15. The method of claim 14, wherein the first portion of the substrate, the first isolation structures, the second portion of the substrate, and the second isolation structures are etched at the same time.

16. The method of claim 14, wherein the maximum depth diffrence amongst the first and second recessed active regions is no more than about 66 Å.

17. The method of claim 14, wherein the substrate is silicon and the first isolation structures comprise oxide.

* * * * *